United States Patent [19]

Polichette et al.

[11] 4,073,740
[45] Feb. 14, 1978

[54] COMPOSITION FOR THE ACTIVATION OF RESINOUS BODIES FOR ADHERENT METALLIZATION

[75] Inventors: Joseph Polichette, South Farmingdale; Edward J. Leech, Oyster Bay; John G. Branigan, Smithtown, all of N.Y.

[73] Assignee: Kollmorgen Technologies Corporation, Dallas, Tex.

[21] Appl. No.: 772,820

[22] Filed: Feb. 28, 1977

Related U.S. Application Data

[62] Division of Ser. No. 587,831, June 18, 1975, Pat. No. 4,042,729, which is a division of Ser. No. 314,748, Dec. 13, 1972, abandoned.

[51] Int. Cl.$^2$ .......................... C11D 7/06; C11D 7/12
[52] U.S. Cl. ..................................... 252/156; 156/642; 156/668; 252/79.5; 427/322
[58] Field of Search ............... 427/304, 307, 322, 430; 204/30, 32 R; 252/79.5, 156; 156/642, 668

[56] References Cited

U.S. PATENT DOCUMENTS

| | | | |
|---|---|---|---|
| 3,650,859 | 3/1972 | D'Ottavio | 156/668 X |
| 3,652,351 | 3/1972 | Guisti | 156/668 |

*Primary Examiner*—William A. Powell
*Attorney, Agent, or Firm*—Morgan, Finnegan, Pine, Foley & Lee

[57] ABSTRACT

Securely bonded layers of electroless metals on bodies having a resinous surface are provided after first contacting the surface of the body with a highly active, easily controllable, readily disposable composition comprising water, permanganate ion and manganate ion, the molar ratio of manganate to permanganate being up to about 1.2 and the composition having a pH controlled in the range of 11 to 13. Means to regenerate the composition and a temperature controlled in the range of 20° C to 100° C are also described.

12 Claims, 3 Drawing Figures

COMPOSITION FOR THE ACTIVATION OF RESINOUS BODIES FOR ADHERENT METALLIZATION

This application is a division of application Ser. No. 587,831 filed June 18, 1975, now U.S. Pat. No. 4,042,729, which in turn is a division of application Ser. No. 314,748, filed Dec. 13, 1972, now abandoned.

The invention relates to compositions and processes useful in preparing base materials having a resinous surface for metallization by electroless techniques.

BACKGROUND OF THE INVENTION

In recent years the art of plating on plastics has made major advances. The old methods had provided little or no adhesion between metal and the plastic so that the composite article lacked strength and durability. The newer techniques have provided good adhesion, from 4 to 20 pounds per inch when measured by the peel test. These newer techniques have used chromic acid to oxidize the smooth, non-polar, non-wettable plastic surface. This oxidative attack on the plastic surface should produce a polar, microporous, wettable surface. In the prior art illustrated in U.S. Pat. No. 3,445,350; U.S. Pat. No. 3,437,507; U.S. Pat. No. 3,533,828; U.S. Pat. No. 3,625,758; and the commonly-assigned copending application, Ser. No. 20,106, filed Mar. 16, 1970 now abandoned, the disclosures of which are incorporated herein by reference, all successful methods of producing this surface used chromic acid. Chromic acid has some serious drawbacks:

1. Chromium compounds are ecologically harmful because they are extremely toxic and the waste and rinse waters are difficult to treat properly;

2. Chromic acid residues on the plastic surface inhibit the electroless deposition processes used to deposit the initial metal film on the plastic article;

3. Chromic solutions are extremely difficult to rinse off which makes adequate rinsing before metallizing and treatment of waste water more difficult.

For many years those skilled in the art have attempted to replace chromic acid by another oxidizing agent in these processes. The usual material proposed to replace chromic acid has been potassium permanganate (Stahl et al., U.S. Pat. No. 3,625,758 suggest using highly acidic permanganate solutions). However, those attempting to use permanganate have not been successful. First, the surface treatment of the plastic would sometimes yield good adhesion and sometimes yield poor adhesion under identical treatment conditions. Second, acid permanganate solutions were notoriously unstable, had a short life and rapidly decomposed to manganese dioxide.

It has now been discovered that stable, highly active solutions for the treatment of resinous surfaces will be provided if the molar ratio of manganate ion $(MnO_4)^{--}$ to permanganate ion $(MnO_4)^{-}$ is not allowed to exceed about 1.2 and if the compositions are controlled with, e.g., pH adjustors or buffers, to provide a pH in the range of 11 to 13.

DESCRIPTION OF THE INVENTION

Figure 1:
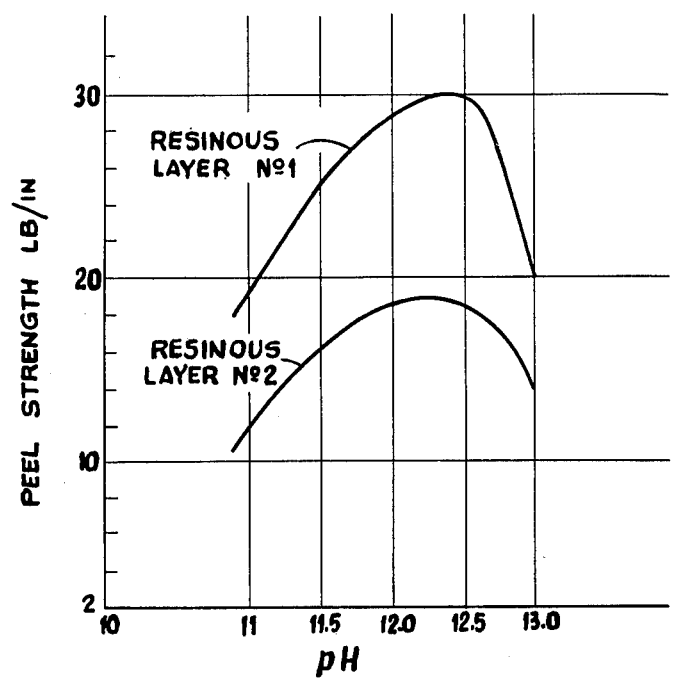
FIG. 1 is a graphical presentation of data comparing electroless metal bond strengths as a function of pH.

According to the present invention, highly active, easily controllable, stable, readily disposable compositions for the activation of electroless metal bonding sites on bodies having resinous surfaces are provided, the compositions comprising water, permanganate ion and manganate ion, the molar ratio of manganate to permanganate being up to about 1.2 and the composition having a pH controlled in the range of 11 to 13. The pH can be controlled and the molar ratio of manganate to permanganate can be maintained in preferred embodiments, by adding a buffer, e.g., a compound selected from phosphorus-containing compounds, boron-containing compounds, carbonate-containing compounds, bicarbonate-containing compounds, or a pH adjustor, e.g., an organic or inorganic acid or base, the latter being added semi-continuously or continuously, as necessary.

There are also provided processes for using the new compositions, and processes to regenerate them.

While not wishing to be bound by any theory of operation it is known from Latimer et al, "Reference Book of Inorganic Chemistry" 3rd Ed. New York, MacMillan Co., 1951, p. 390-2 that at high concentrations of $OH^-$, the ratio of $MnO_4^{--}$ to $MnO_4^-$ may be large.

Molar ratios of manganate to permanganate as a function of pH are given below:

| pH | Manganate/Permanganate |
| --- | --- |
| 14 | 2.5 |
| 13 | 1.2 |
| 12 | 0.5 |
| 11 | 0.25 |

The discovery herein is that the upper limit of pH for the surface treatment solution is the pH where the molar ratio of manganate ion to permanganate ion exceeds 1.2 (about pH 13). Preferably, the molar ratio is below about 1. A preferred pH is between about 11 and about 13, and especially at about 12.5, for resin surfaces 1 and 2 as shown in the drawings. The actual pH selected between 11 and 13 will depend on the resin being treated. For example, the optimum for epoxy is pH 11 to 13, preferably 12.5. For acrylonitrile-butadiene-styrene resins (e.g., ABS and the like), also, the optimum pH is about 11 to 13, preferably 12.5.

Moreover, it is known from Latimer "The Oxidation Potentials of the Elements and Their Potentials in Aqueous Solutions", 2nd Edition, Englewood Cliffs, New Jersey, Prentice-Hall, 1952, p. 240, that "permanganate is unstable with respect to its reduction by water and at moderately high acid, oxygen is slowly evolved. The reaction in neutral or slightly alkaline solution is not appreciable in the dark but is accelerated by light".

Unlike the permanganate solutions of the prior art, including those which are described by Maguire et al. in U.S. Pat. No. 3,689,303, the surface treating baths according to this invention are controlled and stabilized for long life by adjusting the ratio of maganate ion and permanganate ion by controlling the pH to within the specified limits.

Any metal salt of permanganic acid which is stable and soluble to the extent of at least about 2 g./l. in water can be employed, but it is a preferred feature to use an alkali metal, e.g., sodium, potassium, lithium or cesium, etc., or an alkaline earth metal, e.g., calcium, and the like, permanganate salt. Especially preferred because of ready availability at reasonable cost and good solubility are sodium permanganate and potassium permanganate.

The amount of salt of permanganic acid to be employed in the solution can vary broadly, for example, from 1 or 2 grams per liter up to the limit of solubility of permanganate in the medium. However, with sodium permanganate or potassium permanganate, especially good results are obtained in the range of from 1 grams per liter to 60 grams per liter. The rate of bonding sites activation increases up to about 60 grams per liter, but no further increase in rate is noted above this level. Below 10 grams per liter, the rate is somewhat too low for good production rates.

The pH can be controlled by adding acids or bases as called for by the analysis. A convenient method for analysis comprises (i) taking a suitably sized aliquot and cooling to the temperature of measurement, e.g., 20°–25° C; (ii) measuring the pH with a suitable, conventional device, e.g., a pH meter; (iii) adding the pH adjustor until the pH reaches the desired level; (iv) making a note of the amount employed; and (v) then adding a proportionate amount of pH adjustor to the main bath. By way of illustration, a bath will ordinarily drop in pH due to absorption of $CO_2$ from the air, for example, to 11.5. Concentrated aqueous KOH is added dropwise to the aliquot until the pH reaches 12.5. Then the calculated amount of KOH is added to the main bath.

The other important parameter, the ratio of manganate ion to permanganate ion, is also controlled by measuring the ratio in an aliquot by titration with KI. The projected amount of permanganate ion is determined by adding a permanganic acid salt, e.g., potassium permanganate, to the aliquot, then the calculated amount is added to the main bath.

As an alternative method for pH control, an aliquot of the bath is taken, and the pH is read, e.g., 11.0. Then calcium hydroxide solution is slowly added through a burette until calcium carbonate ceases to precipitate. The calcium carbonate is removed by filtration. Then a salt of permanganic acid is added to bring the content up to the desired level. e.g., 40 g. per liter. The amount of reagents used to adjust the aliquot are then scaled-up and added to the main bath.

It is desirable to analyze the main bath for pH and ratio of manganate to permanganate at about weekly intervals.

In embodiments which use buffers to control the compositions, the buffering compound will generally comprise a salt of a phosphorus-, boron-, carbonate- or bicarbonate-containing compound which hydrolyzes in the aqueous medium to produce a weakly acidic or basic reaction substance, thereby, in addition to its function in maintaining the necessary ratio of manganate ion to permanganate ion, also, assists in providing the desired pH range. In preferred embodiments, the buffering compound will be a phosphate buffer, a borate buffer or a buffer comprising carbonic acid or a carbonic acid derivative or gaseous carbon dioxide. In especially preferred embodiments the buffering compound will comprise phosphoric acid and its salts, such as potassium phosphate, potassium carbonate, potassium monobasic phosphate, potassium dibasic phosphate, potassium peroxydiphosphate, potassium pyrophosphate, potassium polyphosphate, or the sodium analogs thereof, and the like, as well as boric acid and its salts, such as potassium borate, biborates, metaborates, orthoborates, and sodium analogs thereof, and the like.

The amount of the pH adjustor or the buffering compound will vary, dependent on the pH desired within the range of 11 to 13 and the type of reaction, acidic or basic, produced in the aqueous medium. In general, with dissolved salts, amounts similar to those of the permanganate salt will be employed for convenience, and from about 2 to about 60 grams per liter of alkali metal phosphate, carbonate, monobasic phosphate, dibasic phosphate or peroxydiphosphate or borate will be used.

Conventional wetting agents, such as fluorinated hydrocarbon wetting agents, can be included in the treating composition, if desired.

Times and temperatures for the treatment step will vary and, generally, higher temperatures promote activation in shorter times. Usually, from 30 seconds to two hours, or even more can be used at temperatures of from about 20° C. to about 100° C. or thereabout. However, best results are obtained between about 40° C. and about 70° C. in times ranging from about 2 to about 20 minutes. Contacting can be made by immersing, dipping, spraying and similar methods applied conventionally to treat resinous surfaces.

When used herein, the term "body having a resinous surface" contemplates plastic materials, e.g., molded articles, laminated articles, resin-coated articles and the like, which are resinous in their entirety or those having at least an outwardly presented resinous surface.

Among the preferred features of this invention are the use of bodies having a resinous surface which has been pretreated to render the surface temporarily polarized and wettable. Such treatments involve dipping or spraying the resinous layer with an agent such as dimethyl formamide, dimethyl sulfoxide, N-methyl-2-pyrrolidone, ketones, halogenated hydrocarbons and mixtures thereof or the like, followed by rinsing in water or a mixture of ethyl acetate and trichloroethylene and the like. This treatment produces a temporarily polarized, wettable surface which is especially amenable to treatment with the instant permanganate solutions to provide high, ultimate bond strengths after metallization. The procedure is described in the above-mentioned copending U.S. Ser. No. 20,106, which is incorporated herein by reference, and in several of the working examples hereinafter.

A further preferred feature of this invention comprises the use of a body having a surface comprising an adherent resinous layer, the layer having uniformly dispersed therein finely divided particles consisting of oxidizable and degradable synthetic or natural rubber. Such bases are disclosed in Stahl et al., U.S. Pat. No. 3,625,758, which is incorporated herein by reference, to save unnecessary detail.

With certain substrates, e.g., an acrylonitrile-butadienestyrene resin, a pretreatment by dipping into a strong solution of sulfuric acid, nitric acid, phosphoric acid, toluenesulfonic acid, a strong amine, or the like is advisable. With such pretreatments exceptionally good bonds with no blistering are obtained. Such advantages are not secured, surprisingly, with this substrate, substituting strong solutions of hydrochloric acid or sodium hydroxide.

Those skilled in the art of electroless metal deposition will understand that if the surface inherently is not active for the deposition of electroless metal, e.g., there is no catalyst such as copper oxide, etc., included in the resinous body, after pre-treatment to promote the activation of bonding sites according to this invention, it will be necessary to include a step for rendering the activated surface catalytic to the reception of electroless metal, prior to contacting with the electroless metal deposition bath. There are many well-known means to render the surface catalytic. Among them are sequential processes such as by immersing the body first in a solution of stannous ions followed by immersing the so-treated body in an acidic solution of precious metal, e.g., palladium or platinum, ions. On the other hand, unitary baths may be employed for such purposes, such as the dispersions of colloidal palladium and tin ions described in Shipley, U.S. Pat. No. 3,011,920, or preferably the soluble complexes of noble metals, stannous ion and anions as described in Zeblisky, U.S. Pat. No. 3,672,938.

The thus-activated (and catalyzed, if necessary), resinous body is then metallized by electroless deposition, for instance, depositing a nickel layer from a conventional acidic nickel hypophosphite bath at a moderately elevated temperature such as 50°-60° C., or from an alkaline nickel bath at about 20° to 35° C., as known in the art. Instead of electroless nickel, electroless copper can be applied from a conventional copper deposition bath which contains, in addition to a reducing agent for cupric ions, a complexing agent, and other conventional ingredients. A suitable copper bath consists of, for example: $CuSO_4.5H_2O$, 30 g./l.; Rochelle salts, 150 g./l.; wetting agent, 1 ml.; sodium cyanide, 30 mg./l.; formaldehyde (37%), 15 ml./l.; and sodium hydroxide in an amount to provide pH 13. Other suitable electroless metal baths are described in U.S. Pat. No. 3,445,350; U.S. Pat. Nos. 3,437,507; 3,433,828; 3,625,758, mentioned above, and incorporated by reference, and gold, silver, cobalt, and other electroless baths are known to those skilled in the art.

Although it is optional, it is preferred practice to follow treatment with the presently disclosed agent to promote the activation of bonding sites, with another agent to "neutralize" the permanganate prior to catalysis and electroless metal deposition. This agent appears to aid in removing any excess permanganate from the resinous surface and prevents dilution and other possible effects due to residual strong oxidizing agent on the subsequent steps and treatment baths in the process. As neutralizers there can be used stannous ions, such as are provided in an acidified stannous chloride bath. Also suitable are bisulfite ions, hydroxylamine, sugar, or, in fact, any generally recognized water soluble compound oxidizable by permanganate. All that is necessary to achieve the desired neutralizing effect is to immerse the permanganate treated substrate in an aqueous solution of the neutralizer, at a concentration, e.g., of from 2 grams to 100 grams per liter for a short time, followed by thoroughly rinsing with water, before the next step is carried out. This optional step will be illustrated in the working examples.

It has been observed that superior bonds are obtained if the metallizing bath is formulated, in known ways, to provide slow deposition of electroless metal. In one manner of proceeding, the deposit is initiated with a slow bath, then the workpiece is moved into a fast electroless bath. This ensures that the slow-down in this key production step is minimized.

A feature of this invention is also to provide a rejuvenation procedure to remove organics and produce permanganate by disproportionation of manganate. In such a procedure:

(i) $CO_2$ is bubbled into the composition to be rejuvenated to lower the pH from 12.5 to within a pH of 11 to 11.5. Disproportionation is favored at this pH range;

(ii) next the composition is heated to 80°-100° C., e.g., for 15 minutes. During this period residual organics are destroyed and manganate ion disproportions to permanganate ion and manganese dioxide;

(iii) next the composition is allowed to cool, e.g., to 20°-45° C., and a carbonate precipitant, e.g., calcium hydroxide or oxide is slowly added to raise the pH back up to 12.5. Carbonate is precipitated;

(iv) the composition is now filtered to remove manganese dioxide and carbonate; and (v) finally, after analysis and appropriate permanganate additions, a rejuvenated composition is obtained.

The pH of the baths can be measured continuously during operation, e.g., by insertion of a suitable, conventional probe or probes, connected to conventional electronics. Alternatively, samples can be taken semi-continuously and the pH measured with external indicators or apparatus. In response to changes in the pH, the adjustor, e.g., acid or base, is added to the main bath to compensate and maintain the desired level. It should be understood that the means for adding the pH adjustor can be made responsive to pH changes by electronic or similar interconnections, so that the pH can be maintained continuously within the desired range without the need for attention by an operator.

DESCRIPTION OF THE PREFERRED EMBODIMENTS

The following examples illustrate the process of the present invention and describe the metallized articles prepared thereby. They are illustrative and are not to be contrued to limit the invention in any manner whatsoever.

EXAMPLE 1

The following example illustrates the use of an activating bath in which the pH and manganate/permanganate ratio are controlled by use of a strong base.

An epoxy-glass laminate having a resin-rich epoxy, phenolic, nitrile rubber surface coating is metallized by the following procedure:

(a) clean the surface and rinse with water (b) immerse for 2 minutes at about 60° C. with mild agitation in a solution comprising:
$KMnO_4$: 40 g.
KOH (45% aqueous): to pH 12.5
water (to make): 1000 ml.

(c) rinse in still (not running) water (d) neutralize for 5 min. at 20°-25° C. in a solution comprising:
hydroxyamine . HCl: 50 g.
con. HCl: (37% aqueous): 20 ml.
water (to make): 1000 ml.

(e) immerse 2 min. at 20°-25° C. in water containing 300 ml./l. of 37% hydrochloric acid;

(f) rinse with flowing water at 20°-25° C.;

(g) immerse for 10 minutes in a sensitizer solution comprising:
palladium chloride: 1 g.

stannous chloride: 60 g.
conc. HCl (37% aqueous): 100 ml.
water (to make): 1000 ml.
in the form of a palladium chloride — stannous chloride complex (U.S. Pat. No. 3,672,938);

(h) rinse with water;

(i) immerse at 55° C. in an electroless copper deposition bath, e.g., U.S. Pat. No. 3,672,986, Example 7, for about 50 hours to deposit a coating of ductile electroless copper about 1 mil thick; and (j) rinse with water and air dry.

The metallized layer is tested for adhesion by measuring the peel strength in standard procedures. High peel strengths, of greater than 10 lb./in. and up to 12.5 lb./in. are obtained, with an average of about 10.7 lb./in. for 6 specimens.

EXAMPLE 2

The procedure of Example 1 is repeated, substituting a molded plaque of butadiene-acrylonitrile-styrene graft copolymer including minor proportions of stabilizers, plasticizers and pigments (Cycolac EP 3530, manufactured by the Marbon Chemical Division of Borg Warner Corporation) and including a pre-treatment dip in 80% by weight aqueous sulfuric acid at 23° C. for 3 to 10 minutes. Immersion in the activating solution at pH 12.5, is for 10 minutes at 23° C. Excellent bond strengths and unblistered metallized layers are obtained.

The following examples illustrate baths in which the manganate/permanganate ratios and pH are controlled with buffering compounds.

EXAMPLE 3

A molded plaque of a butadiene-acrylonitrile-styrene graft polymer (Cycolac EP 3530) is metallized in the following procedure:

(a) clean the surface for 5 minutes at 70° C. in water containing 50 g./l. of trisodium phosphate;

(b) rinse with water;

(c) immerse for 5 minutes at about 20°–25° C. with mild agitation in a solution comprising:
methyl ethyl ketone: 200 ml.
non-ionic wetting agent (Triton X-100, Rohm & Haas Co.): 1 ml.
water (to make): 1000 ml.

(d) promote the activation of bonding sites by immersion for 10 min. at 70° C. in a solution comprising:
Formulation No. 3 (see following Table);

(e) rinse in still (not running) water;

(f) neutralize (optional) for 5 min. at 20°–25° C. in a solution comprising:
stannous chloride dihydrate: 30 g.
hydrochloric acid (37%): 330 ml.
water (to make): 1000 ml.

Sensitization and metallization are carried out by the procedure outlined in Example 1, steps (e) through (j), respectively.

The metallized plaque is tested for adhesion by measuring the peel strength in standard procedures. A high peel strength value, ranging from 7 to 10 lbs. per inch (the width of the torn metal strip) is obtained.

EXAMPLE 4

The procedure of Example 3 is repeated, substituting for the promoting bath in step (d) a solution comprising:
Formulation No. 4 (see Table hereafter).
Strongly bonded metal layers are obtained after electroless deposition.

EXAMPLE 5

The procedure of Example 3 is repeated, substituting for the promoting bath in step (d), a solution comprising:
Formulation No. 5 (see Table hereafter).
Strongly bonded metal layers are obtained after electroless deposition.

EXAMPLE 6

The procedure of Example 3 is repeated, substituting for the promoting bath in step (d), a solution comprising:
Formulation No. 6 (see Table hereafter).
Strongly bonded metal layers are obtained after electroless deposition

EXAMPLE 7

The procedure of Example 3 is repeated, substituting for the promoting bath of step (d), a solution comprising:
Formulation No. 7 (see Table hereafter).
Strongly bonded metal layers are obtained after electroless deposition.

EXAMPLE 8

The procedure of Example 3 is repeated substituting for the promoting bath in step (d), a borate stabilized solution comprising:
Formulation No. 8 (see Table hereafter).
Strongly bonded metal layers are obtained after electroless deposition.

Table

| Formulation No. | Activating Bath Compositions | | | | | |
|---|---|---|---|---|---|---|
|  | 3 | 4 | 5 | 6* | 7 | 8 |
| $KMnO_4$, g. | 40 | 40 | 40 | 40 | 40 | 40 |
| $KH_2PO_4$, g. | 40 | — | — | — | — | — |
| $K_2HPO_4$, g. | — | 40 | — | 30 | — | — |
| $K_3PO_4$, g. | — | — | 40 | — | — | — |
| $K_2CO_3$, g. | — | — | — | — | 40 | — |
| $K_3BO_3$ | — | — | — | — | — | 40 |
| water (to make) | 1000 | 1000 | 1000 | 1000 | 1000 | 1000 |
| pH | 4.2 | 8.9 | 11.6 | 12.5 | 11.0 | 10–12 |

*Sufficient KOH is included to reach pH 12.5.

A series of activating solutions containing 40 g./l. of potassium permanganate and 30 g./l. of $K_2HPO_4$ are prepared and adjusted to several pH's within the range of 11–13.0. Activated surfaces are prepared according to the general procedure of Example 1, but using a 70° C. activating bath temperature and a 15 minute immersion.

The neutralizing bath comprises 50 g./l. of hydroxyamine-hydrochloride and 20 ml./l. of 37% hydrochloric acid.

After metallization the peel strengths in pounds/inch are determined, and the data are graphically represented in FIG. 1. The upper curve, represents data from activation of one type of resin layer; the lower curve represents data from activation of a second type of resin layer, namely an epoxy, phenolic, nitrile rubber adhesive.

These data indicate that high bond strengths are secured and that an especially preferred maximum is obtained at between 12 and 12.5 on the pH scale.

Figure 3:
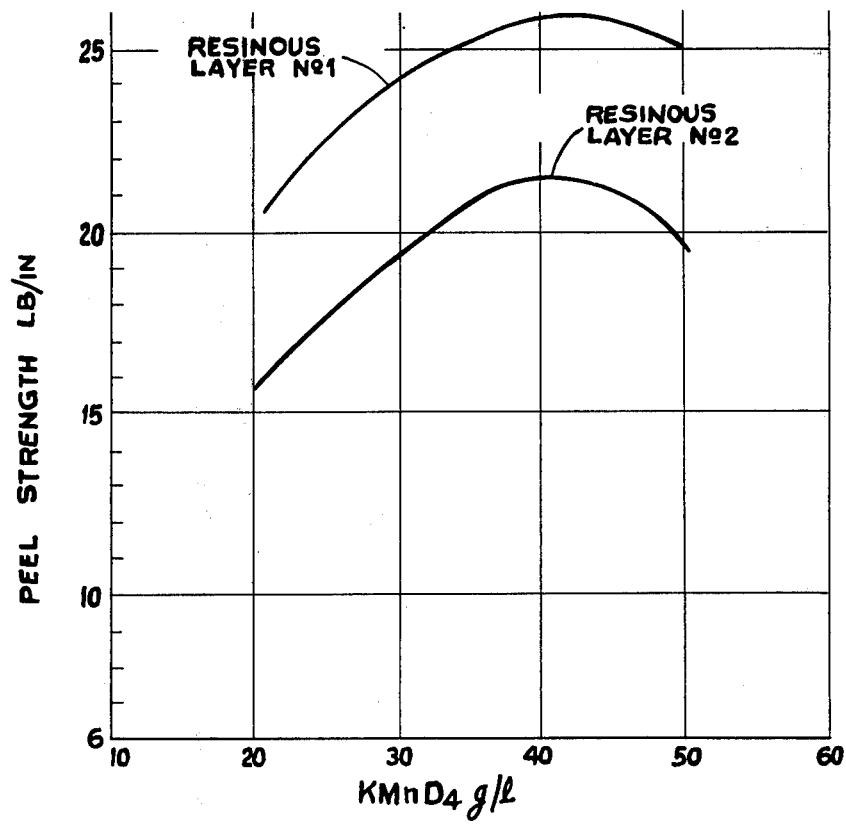
FIG. 3 is a representation of data comparing electroless bond strengths as a function of permanganate salt concentration as a result of treating resinous surfaces in activating baths of the present invention, prior to metallization.
Figure 2:
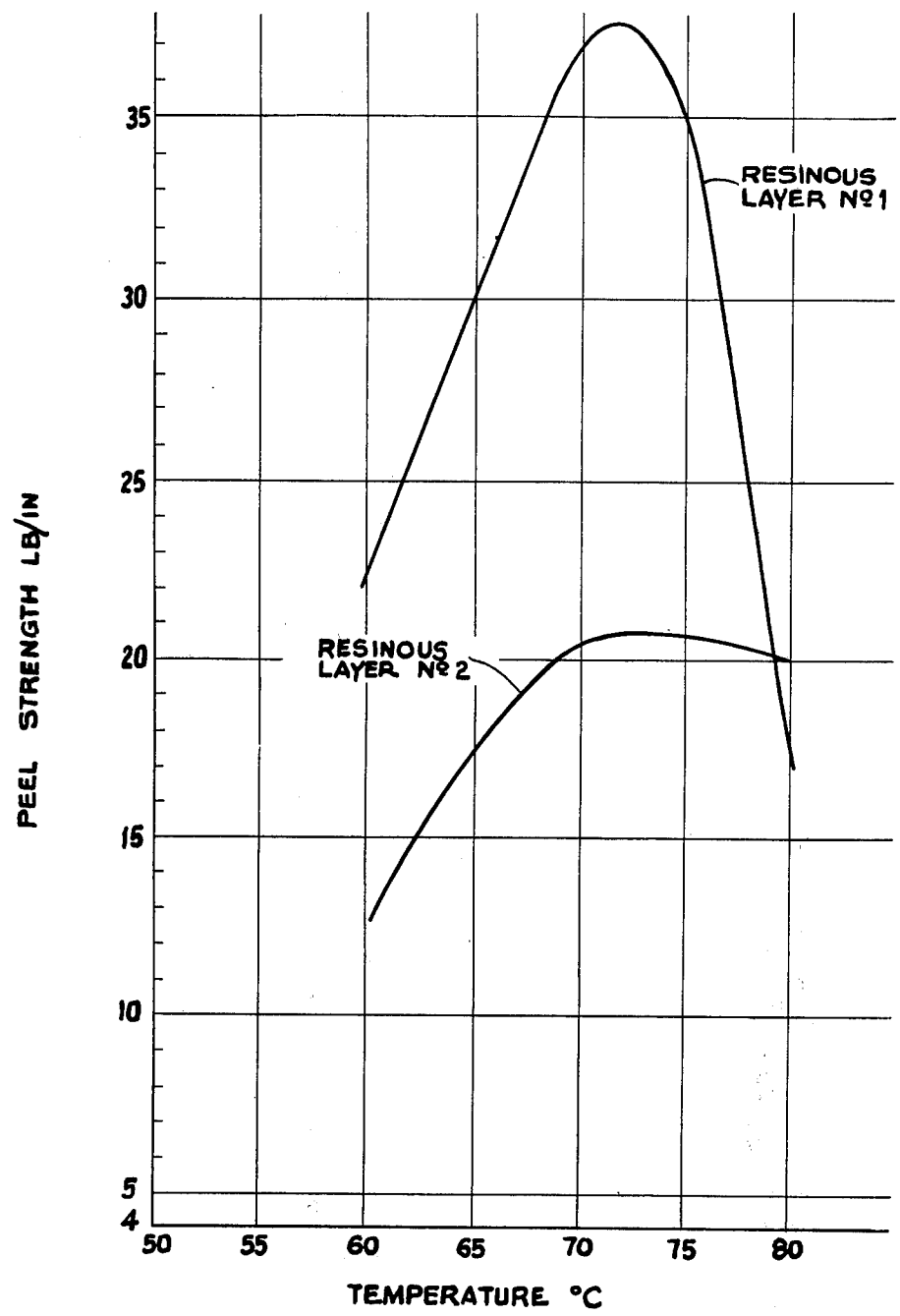
FIG. 2 compares electroless bond strengths as a function of temperature of the activating bath.

Similarly, the effect of temperature on peel strength was determined by preparing an activation bath containing 40 g./l. of potassium permanganate, 30 g./l. of $K_2HPO_4$, adjusted to pH 12.5 with potassium hydroxide. The general procedure of Example 1 was employed with an activation time of 15 minutes, and the temperature of the activation bath was varied over the range of 60°–80° C. The data are presented in graphical form in FIG. 2. The upper curve represents data from activation of one type of resin layer; the lower curve represents data from activation of a second type resin layer, Similarly, the effect of permanganate concentration on peel strength was determined by preparing an activating bath containing 30 g./l. of $K_2HPO_4$ adjusted to pH 12.5 with potassium hydroxide and then the permanganate concentration varied within the range 20–50 g./l. These baths were used in the procedure of Example 1 with an activation time of 15 minutes and the temperature of the activation bath was maintained at 70° C. The data are presented in graphical form in FIG. 3. The upper curve, represents data from activation of one type of resin layer; the lower curve represents data from activation of a second type of resin layer, namely an epoxy, phenolic, nitrile rubber adhesive.

Instead of the copper bath, other Group IB and VIII electroless metal baths can be used, e.g., the nickel baths described in Brenner, Metal Finishing, Nov. 1954, pages 68–76, or the gold baths described in U.S. Pat. No. 2,976,181. Likewise, cobalt, silver and other baths well known to those skilled in this art can be used.

Obviously, other modifications will suggest themselves to those skilled in the art in the light of the above teachings.

For example, instead of water alone as the solvent, a mixture of water and other non-oxidizable solvents, such as acetic acid, and the like can be used in the activation solutions. Instead of potassium permanganate, sodium and lithium permanganate can be substituted. Instead of potassium carbonate, potassium hydroxide, and the like, the sodium and lithium analogs may be substituted. In certain embodiments, instead of methyl ethyl ketone (Example 1, step (c)), dimethyl formamide, methyl chloride, dimethyl sulfoxide and N-methyl-2-pyrrolidone can be substituted.

It has been demonstrated that, in comparison with the prior art processes outlined above, the present invention provides an improved agent for promoting the activation of bonding sites on resinous surfaces prior to contact with an electroless metal deposition solution.

The stabilized permanganic acid salt solutions of the present invention are fully equivalent in activity and resultant adhesion to the well-known chromic acid baths described in the prior art and used in the technology of metal plating on plastics.

The present baths overcome the notoriously costly and difficult waste treatment problems of chromic acid and chromic acid/sulfuric acid baths; they avoid associated hazards to the operators of process equipment; and they obviate the need for costly materials of construction of tanks and equipment such as heaters, mixers and exhaust systems.

Moreover, permanganate solutions within the specified pH range of 4 to 13 are stable, in contrast with the highly acidified baths proposed by others skilled in this art. It has been found, for example, that highly acidified aqueous permanganates, i.e., 2 to 10 g./l. $KMnO_4$ and 600 ml./l. conc. $H_2SO_4$ or 500 ml./l. of 85% $H_3PO_4$, are subject to unexpected and rapid decomposition. On the other hand, although aqueous permanganates rendered highly alkaline with strong bases are very stable, they are not effective as rapid promotors of the formation of bonding sites and they produce low adhesion values.

The invention is not limited to any particular article, such as printed circuit boards, or to the specific steps and methods described.

We claim:

1. A stable, readily disposable composition for treating a resinous surface to receive an adherent deposit of electrolessly formed metal, said composition comprising water, permanganate ion and manganate ion in the molar ratio of manganate ion to permanganate ion of up to 1.2, said composition having a pH in the range of 11 to 13.

2. A composition as defined in claim 1 wherein the ratio of manganate ion to permanganate ion and the pH are controlled either (i) by buffering or (ii) by adding a pH adjustor semicontinuously or continuously.

3. A composition as defined in claim 1 wherein the pH is about 12.5.

4. A stable, readily disposable composition for treating a resinous surface to receive an adherent deposit of electrolessly formed metal, said composition comprising water, permanganate ion and manganate ion in the molar ratio of manganate ion to permanganate ion of up to 1.2 and a buffering agent in the range of from about 2 to about 60 grams per liter selected from the group consisting of phosphorus-containing compounds, boron-containing compounds, carbonate-containing compounds, bicarbonate-containing compounds and mixtures of the foregoing in an amount at least sufficient to maintain said molar ratio of manganate ion to permanate ion and the pH of said composition within the range of 11 to 13.

5. A composition as defined in claim 4 wherein the pH is about 12.5.

6. A stable, readily disposable composition for treating a resinous surface to receive an adherent deposit of electrolessly formed metal, said composition comprising water, permanganate ion and manganate ion in the molar ratio of manganate ion to permanganate ion of up to 1.2, the salt from which said permanganate ion is derived being in the range of from 1 gram per liter to 60 grams per liter, said composition having a pH in the range of 11 to 13.

7. A stable, readily disposable composition for treating a resinous surface to receive an adherent deposit of electrolessly formed metal, said composition comprising water, permanganate ion and manganate ion in the molar ratio of manganate ion to permanganate ion of up to 1.2, the salt from which said permanganate ion is derived being in the range of from 1 gram per liter to 60 grams per liter, and a buffering agent in the range of from about 2 to 60 grams per liter, selected from the group consisting of phosphorus-containing compounds, boron-containing compounds, carbonate-containing compounds and mixtures of the foregoing in an amount at least sufficient to maintain said molar ratio of manganate ion to permanganate ion, the pH of said composition being within the range of 11 to 13.

8. A composition as defined in claim 1 wherein the composition comprises from about 20 to about 50 grams/liter of potassium permanganate.

9. A composition as defined in claim 1 wherein the temperature is between about 60° and 80° C.

10. A composition as defined in claim 1 wherein the temperature is about 70° to 75° C.

11. A process for restoring the activity after extended use of a composition as defined in claim 1 and having a pH of not substantially less than about 12.5, said process comprising passing carbon dioxide into the composition until the pH is lowered to the range of about 11 to 11.5, heating the composition at a temperature of from about 80° C. to about the boiling point of said composition for a period of time sufficient to decompose any residual organic compounds which may be present and also to complete the disproportionation of manganate ion to permanganate ion and manganese dioxide, cooling the composition and adding a precipitant for carbonate ion, and removing the manganese dioxide and precipitated carbonate ion from the composition.

12. A process as defined in claim 11 wherein the precipitant for carbonate ion is calcium hydroxide or calcium oxide, and said precipitant is added in a quantity sufficient to raise the pH of said composition to about 12.5.

* * * * *